US011501989B2

(12) United States Patent
Shi

(10) Patent No.: US 11,501,989 B2
(45) Date of Patent: Nov. 15, 2022

(54) CONTROL PRODUCT FLOW OF SEMICONDUCTOR MANUFACTURE PROCESS

(71) Applicant: Weiping Shi, College Station, TX (US)

(72) Inventor: Weiping Shi, College Station, TX (US)

( * ) Notice: Subject to any disclaimer, the term of this patent is extended or adjusted under 35 U.S.C. 154(b) by 374 days.

(21) Appl. No.: 16/754,424

(22) PCT Filed: Oct. 11, 2018

(86) PCT No.: PCT/US2018/055365
§ 371 (c)(1),
(2) Date: Apr. 8, 2020

(87) PCT Pub. No.: WO2019/075174
PCT Pub. Date: Apr. 18, 2019

(65) Prior Publication Data
US 2020/0357670 A1    Nov. 12, 2020

Related U.S. Application Data

(60) Provisional application No. 62/571,581, filed on Oct. 12, 2017.

(51) Int. Cl.
*G05B 19/418* (2006.01)
*H01L 21/67* (2006.01)
*H01L 21/66* (2006.01)

(52) U.S. Cl.
CPC .. *H01L 21/67276* (2013.01); *G05B 19/41865* (2013.01); *H01L 22/20* (2013.01); *G05B 2219/32301* (2013.01); *G05B 2219/45031* (2013.01)

(58) Field of Classification Search
CPC .............. H01L 21/67276; H01L 22/20; G05B 19/41865; G05B 2219/32301; G05B 2219/45031; Y02P 90/02
See application file for complete search history.

(56) References Cited

U.S. PATENT DOCUMENTS

| | | | |
|---|---|---|---|
| 6,380,618 B1 | 4/2002 | Wang et al. | |
| 6,788,985 B2 | 9/2004 | Mitsutake et al. | |
| 7,610,111 B2 | 10/2009 | Lin et al. | |
| 8,792,150 B2 | 7/2014 | Moriyama et al. | |
| 2003/0149506 A1* | 8/2003 | Haanstra | H01L 21/67276 700/121 |
| 2006/0106477 A1 | 5/2006 | Miyashita | |

(Continued)

OTHER PUBLICATIONS

International Search Report & Written Opinion received in PCT/US2018/055365 dated Dec. 20, 2018, pp. 14.

*Primary Examiner* — Kidest Bahta
(74) *Attorney, Agent, or Firm* — Zhong Law, LLC

(57) ABSTRACT

A system and method include receiving, by a processing device of a manufacturing execution system (MES), a target profile associated with products, wherein the target profile comprises an identifier of a block of steps in a process to make the products and a target work-in-progress (WIP) value representing a target number of parts waiting to be processed by a group of machines used in the block of steps to make the products, identifying a move list or an assignment list that, when issued, causes the group of machines to operate to maintain a number of parts waiting for processing to match the target WIP value of the target profile.

18 Claims, 4 Drawing Sheets

(56) References Cited

U.S. PATENT DOCUMENTS

| | | | |
|---|---|---|---|
| 2009/0037012 A1 | 2/2009 | Weigang et al. | |
| 2009/0326996 A1* | 12/2009 | Goh | G06Q 50/04 705/7.27 |
| 2010/0185311 A1* | 7/2010 | Hsieh | G05B 19/402 700/121 |

* cited by examiner

CONTROL PRODUCT FLOW OF SEMICONDUCTOR MANUFACTURE PROCESS

RELATED APPLICATION

This application claims priority to U.S. Provisional Application 62/571,581 filed Oct. 12, 2017, the content of which is incorporated by reference in its entirety.

TECHNICAL FIELD

The present disclosure relates to a system and method to control the manufacture process of semiconductor products, and in particular, to a system and method to control, using a target profile, the wafers waiting to be processed (referred to as work-in-processes, or WIPs) through the semiconductor manufacture process.

BACKGROUND

A plant may include different types of machines to perform a series of steps of a manufacturing process that produces the eventual products. For example, the manufacture process to fabricate semiconductor products may include the steps of wet cleans, photolithography, Ion implantation, dry etching, wet etching, plasma ashing, thermal treatments, chemical vapor deposition (CVD), physical vapor deposition (PVD), molecular beam epitaxy (MBE), electrochemical deposition (ECD), chemical-mechanical planarization (CMP), wafer testing, and wafer backgrinding. Each of these steps (or sub-steps) may be performed once or repeatedly during the manufacture process. Each step may be performed by one or more semiconductor manufacture machines (or groups of machines), and each machine may participate in one or more than one steps. Thus, a piece of raw wafer may undergo the steps (and sub-steps) of the manufacture process to produce the eventual products (e.g., the ICs).

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
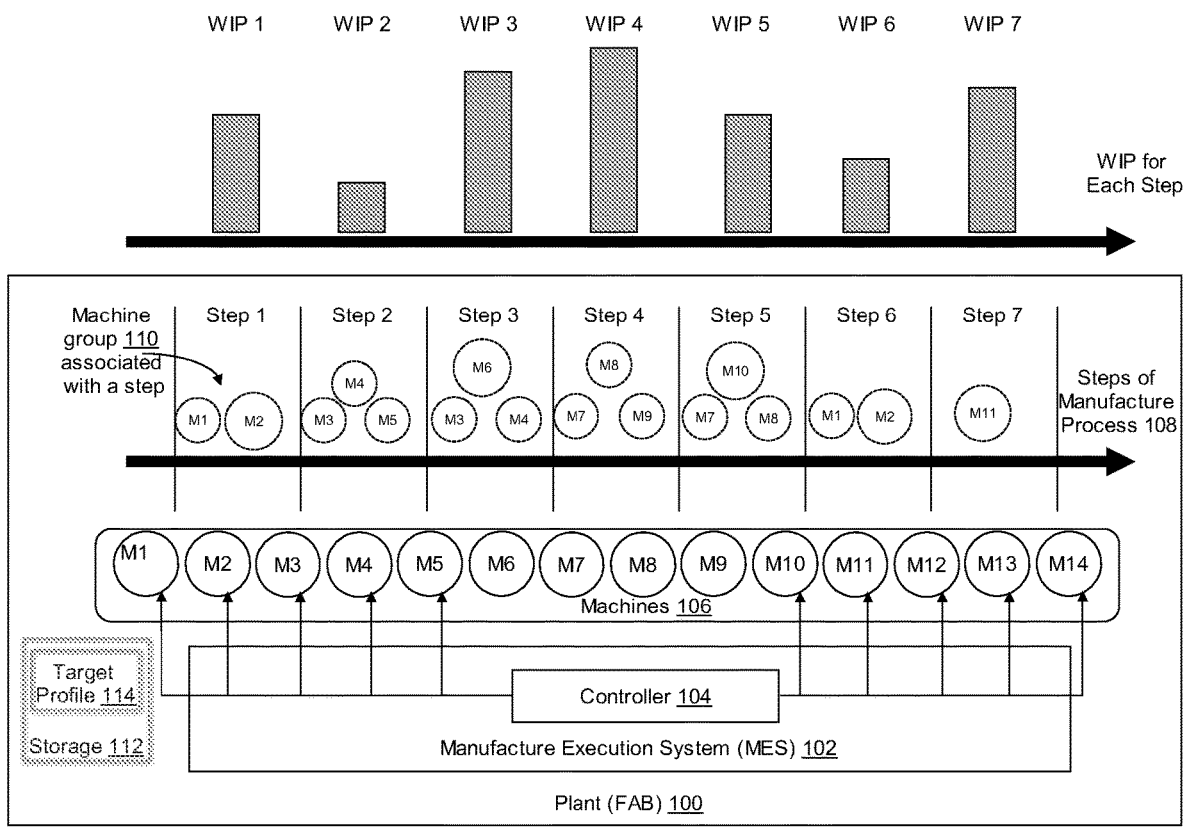
FIG. 1 illustrates a semiconductor manufacture plant according to an implementation of the present disclosure.

In one particular example, the plant may be a semiconductor manufacture plant (referred to as a FAB). The manufacture parts can be semiconductor wafers that undergo different manufacture steps to produce integrated circuits (ICs). Normally, an apparatus may carry up to 25 semiconductors wafers that can be processed and transported together. The wafers in the apparatus are referred to as a wafer lot.

A semiconductor manufacture plant may utilize thousands of machines to produce hundreds of products concurrently through one or more manufacture processes. Each manufacture process may include hundreds of steps (or sub-steps) needed for fabricating the products. Different types of machines may be deployed for different steps. A same type of machines can also be utilized to perform different steps in the manufacture process. Thus, the production capacity of a machine may be divided to meet the demands to perform different steps of the manufacture process, and the processing of each step may be carried out by a group of machines with varying capacity assigned to the step. For example, a lithography machine that may perform both device steps and interconnect steps may dedicate 30% of its capacity to the device steps and 70% of its capacity to the interconnect steps. The capacity division may be achieved by proportionally dividing the time of a day for which a machine spent on different steps (e.g., 30% of the day working on devices and 70% of the day working on interconnect).

Each machine may have a certain capacity to process a certain number of wafers (or numbers of wafer lots) associated with one or more manufacture steps for a duration of time (e.g., a day or a week). The manufacture process may include a sequence of manufacture steps in which a wafer is processed. At each step, the machines (or the machine group) assigned to the step may receive wafers that had been processed by machines of the previous step, and produce the wafers for the next step. To maximize the capability of the semiconductor manufacture plant, it is desirable to have all machines of the semiconductor manufacture plant to run at or substantially close to their full capacities. To ensure that each machine of a step runs at its full capacity, a certain number of wafers (or wafer lots) should be available, waiting to be processed by the machine of that step. The number of wafers (or wafer lots) waiting to be processed is referred to as WIP $(P_i, S_j)$ where $P_i$, i=1, ..., N represents the $i^{th}$ product, and $S_j$, j=1, ..., M represents the $j^{th}$ step in the manufacture process to product $P_i$, and N and M are integers greater than one.

The number of wafers waiting to be processed may directly affect the overall utilization rate of the semiconductor manufacture plant. In one implementation, the overall utilization rate of a plant is defined by the average utilization rate of all machines in the plant over a period of time, where the utilization rate of a machine is the ratio of the actual number of wafers processed by the machine over the number of wafers that could have been processed by the machine running at the full capacity. When there are fewer than sufficient numbers of wafers waiting to be processed at a step, the machines (or machine group) for this step do not have enough parts to process at their full utilization rates. A sufficient number of waiting wafers not only guarantees that the machines run full time, but also reduces the frequency of product change. When a machine changes a product to work on, additional time may be needed to prepare the machine. For example, if a lithography machine switches from processing wafers of product A to processing wafers of product B, the lithography machine needs to take some time off to change the reticle from A to B. In contrast, if the lithography machine continuously processes wafers of product A, no reticle change is needed. Alternatively, when the number of waiting wafers at a step exceeds the collective capacities of the machines (or machine group) assigned to the step, wafers may have to wait a long time before being processed, causing a long production time, or causing the wafers to be defective due to extended waiting time. The long production time may cause late delivery to the customer and/or excessive WIPs which may impact the cash flow. Thus, excessive WIPs may indicate that the machines (machine group) assigned to the previous steps may have consumed higher capacities than they should have. The overall utilization rate of the semiconductor manufacture plant is less than optimal because these extra capacities used by previous steps could have been redistributed to other steps to reduce the bottlenecks of later steps. Proper redistribution of capacities may improve the overall utilization rate of the semiconductor manufacture plant.

The method to compute the optimal target WIP profile for each group of machines, through simulation for a certain period of time (e.g., a week or a month), may include changing the WIP and calculating the utilization rate. If increasing the WIP causes the utilization rate to increase, indicating that the optimal target WIP should be increased until any further increase of the WIP causes no improvements on the utilization rate. Similarly, if decreasing the WIP causes the utilization rate to increase, indicating that the optimal WIP should be decreased until any further decrease of the WIP causes no further improvements on the utilization rate. Although higher WIP may increase the machine utilization, higher WIP may also increase the waiting time. Therefore, there is a tradeoff between waiting time and increase of the utilization rate. The tradeoff may be decided based on actual increase in the utilization and waiting time by the FAB manager.

In one implementation, the simulation to compute optimal target WIP profile may be carried out for part of the FAB or even for a particular machine group. The partial simulation may reduce the simulation time. In another implementation, the simulation may be directed to a particular step of the process while the results of prior step may be set manually.

Implementations of the present disclosure provide a technical solution that includes a system and method to control the numbers of wafers waiting to be processed (WIPs) at different steps to achieve an overall optimal utilization rate for the semiconductor manufacture plant. Rather than controlling the WIPs for each individual step, implementations of the present disclosure employ a target WIP profile to achieve the overall optimal utilization rate. The target WIP profile may include target numbers of wafer waiting to be processed for each step in a manufacturer process. This target profile may be determined after taking into consideration of the overall optimal state of the plant. Further, implementations may include a controller to allocate machines capacities to different steps and send requests to machines to run these machines in a fashion that matches the numbers of wafers to be processed in different steps to the target profile over a period of time. The implementations may include a list of required number of wafers for each product step that is processed by each machine or machine group in order to achieve the target profile. This match between the numbers of wafers waiting to be processed and the target profile enables the semiconductor manufacture plant to run smoothly at its optimal utilization rate.

Figure 4:
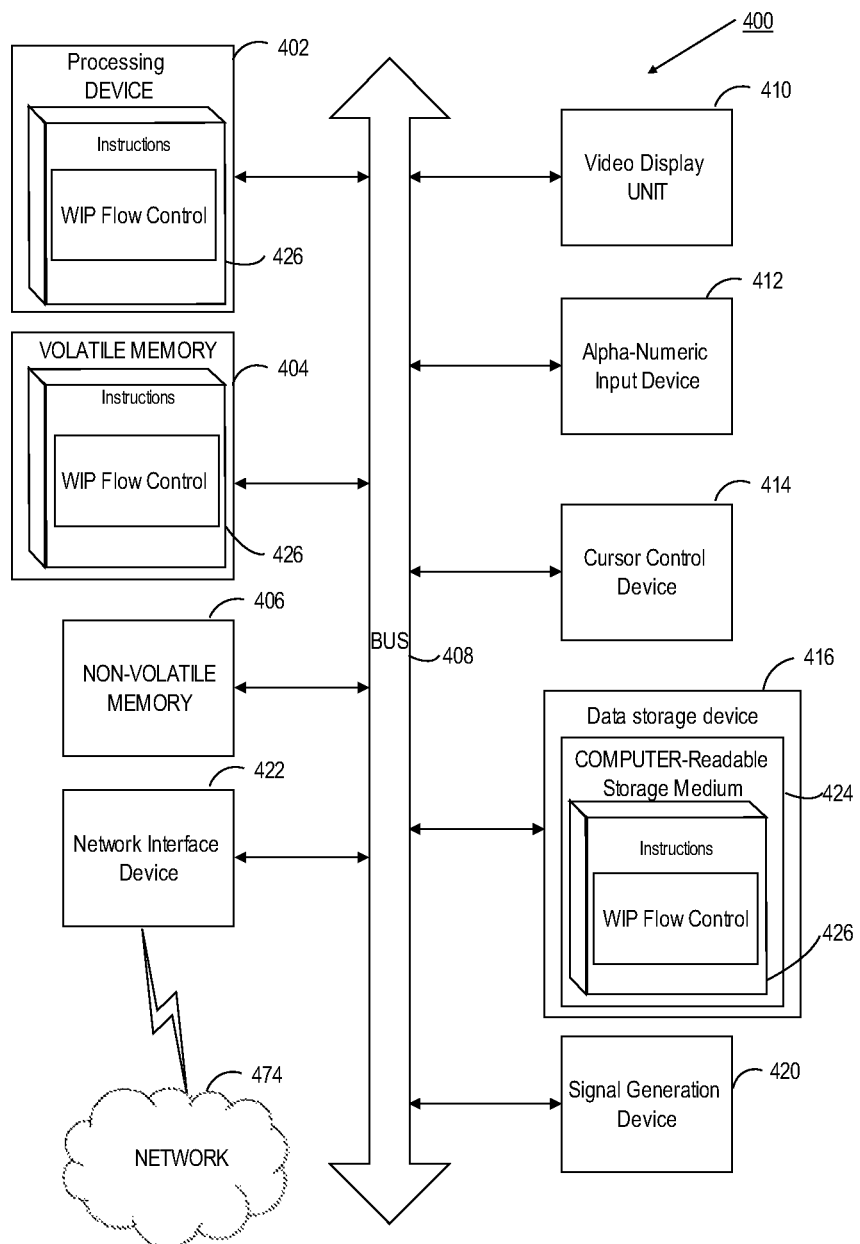
FIG. 4 depicts a block diagram of a computer system operating in accordance with one or more aspects of the present disclosure.

FIG. 1 illustrates a semiconductor manufacture plant 100 according to an implementation of the present disclosure. Plant 100 may include a manufacture execution system (MES) 102 that may control multiple machines 106 (e.g. M1-M14) using a controller 104. MES 102 may include a dispatcher system or a scheduling system that dispatches wafers or wafer lots to machines in a FAB. MES 102 can include a computer system (as shown in FIG. 4) including a processing device (e.g., a central processing unit (CPU)). MES 102 may also include a storage device 112 to store information associated with machines.

Each one of machines 106 may participate in performing one of more steps in a series of steps (e.g., Step 1-7) of a manufacture process 108. Each step may require contributions from one or more machines 106. The combinations of machines assigned to a step may be referred to as a machine group 110. Different groups of machines may include different types of machines, or may share same machines among several groups. As shown in FIG. 1, both Step 1 and Step 6 may be associated with a first machine group including M1 and M2, where the group may contribute a portion of its capacity to Step 1 and a portion of its capacity to Step 6. Step 2 may be associated with a second machine group including M3, M4, and M5 with each one contributing a portion of their respective capacities. At each step, there is a corresponding number (WIP #) of wafers (or wafer lots) waiting to be processed. A wafer (or a wafer lot) after being processed at Step N may become part of WIPs for the following Step N+1.

The manufacture process 108 may include hundreds of steps (or sub-steps). To facilitate the management, in one implementation, these steps may be divided into disjoint subsets of steps. These disjoint subsets are referred to as blocks herein, where each block may include one or more steps. The WIP for each block may be defined as the sum of WIPs for the steps in the block.

In one implementation, the processing device of MES 102 may include a controller 104 to issue requests to machines 106. The requests may include information to control which machines and their corresponding capacities are assigned to a block, thus controlling the WIP of that block. The request may also include information to control which product steps or blocks the machine group needs to process, thus controlling the WIP of the steps or blocks related to the machine group. For example, the request to machine group {M1, M2} may simultaneously control the WIP in front of Step 1 and Step 6. In one implementation, controller 104 may include logic circuit that is programmed to issue these requests. In another implementation, controller 104 may be a software application executing on the processing device of MES 102.

Figure 2:
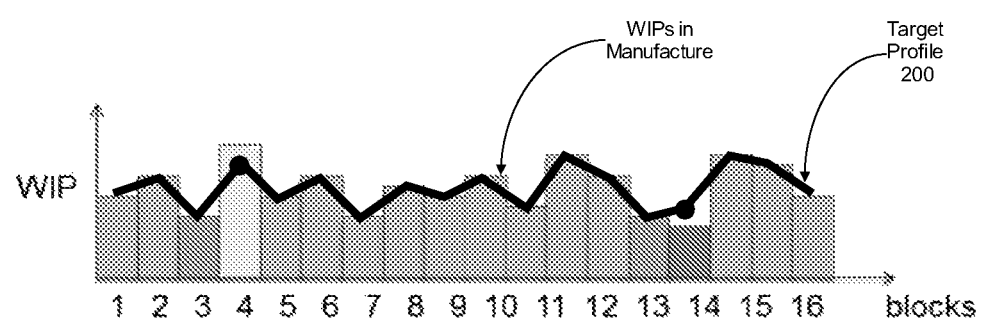
FIG. 2 depicts a target profile used for controlling the flow of WIPs according to an implementation of the present disclosure.

In one implementation, a target WIP profile 114 of WIPs distributed across a sequence of steps or blocks may be specified and stored in a storage device 112 associated with the MES 102. The target profile 114 may be specified based on historical performance data of the plant. The target profile 114 may be generated based on operator experience, the current conditions of the plant (e.g., how many machines are in working condition), and the wafer production plan based on customer demands. The target profile 110 may be computed using a simulator, based on current conditions of the plant, the current conditions of the machines, or the wafer production plan. FIG. 2 depicts a target profile 200 used for controlling the flow of WIPs according to an implementation of the present disclosure. As shown in FIG. 2, the target profile 200 may be composed of a sequence of blocks (e.g., blocks 1-16) and the WIPs associated with each block, where each block may contain one or more steps. The target profile may be represented using a function WIP $(P_i, B_j)$, where $P_i$, i=1, ..., N represents the $i^{th}$ product, and $B_j$, j=1 ..., M represents the $j^{th}$ block in the manufacture process to product $P_i$. Thus, the target profile for a semiconductor manufacture plant may include N profile functions for the N products manufactured at the plant. In one implementation, the N profile functions may be combined together as a total WIP target profile. The combination may include merging different product steps according to their corresponding machines and processing recipes. The total WIP profile may be represented using a function WIP($B_j$), where $B_j$ represents the block j.

Target profile 200 represents an optimal state for running manufacture process 108. The maintenance of WIPs at steps or blocks as planned according to the target profile can ensure a smooth and efficient manufacture process. The WIPs at different steps or blocks, however, may change due to the continued processing of wafers through manufacture process 108. The deviations of the WIPs at blocks from the target profile may result in bottlenecks in the manufacture process. For example, as shown in FIG. 2, block 4 may have WIPs that exceed the target value for block 4, and block 14 may have WIPs that are below the target value for block 14. These misses for the target values at blocks 4 and 14 may cause inefficiencies for the FAB.

Implementations of the present disclosure may include a controller 104 as part of MES 102 to control the WIPs at different steps or blocks to substantially match target profile 200 while wafers (or wafer lots) are moving through the manufacture process from block 1 to block 16. To this end, controller 104 may issue requests to machines 106 to adjust the assignment of machine capacities to different blocks. The assignment of machines to different blocks may also include assign portions of capacity of a machine to different blocks over specified time periods. The controller 104 may issue a request that contains a move list to each machine or machine group. The move list may specify for each product step or recipe, the numbers of wafers or wafer lots to be process by the machine or machine group, over a specific time period.

Figure 3:
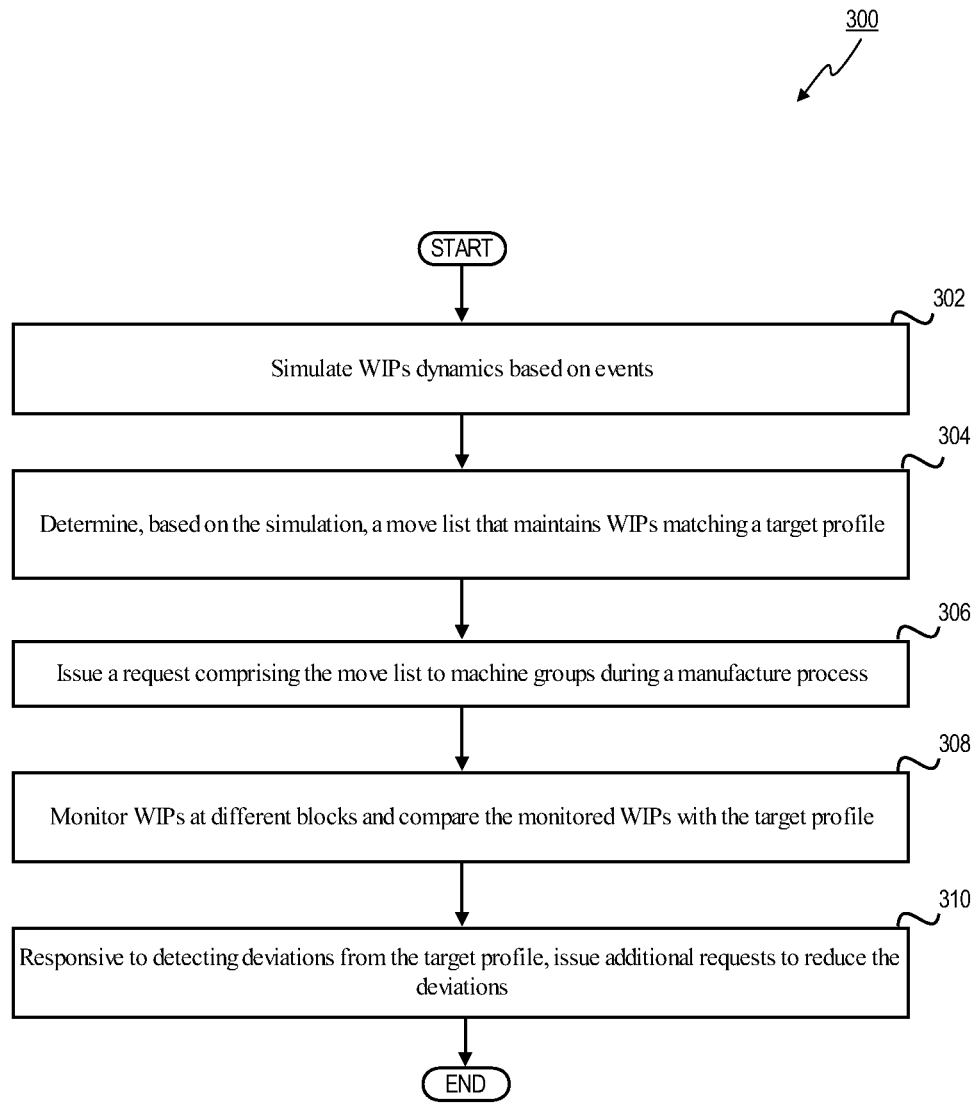
FIG. 3 depicts a flow diagram of a method for controlling the WIPs to match to a target profile according to an implementation of the present disclosure.

FIG. 3 depicts a flow diagram of a method 300 for controlling the WIPs to match to a target profile according to an implementation of the present disclosure. Method 300 may be performed by processing devices that may comprise hardware (e.g., circuitry, dedicated logic), computer readable instructions (e.g., run on a general purpose computer system or a dedicated machine), or a combination of both. Method 200 and each of its individual functions, routines, subroutines, or operations may be performed by one or more processors of the computer device executing the method. In certain implementations, method 300 may be performed by a single processing thread. Alternatively, method 300 may be performed by two or more processing threads, each thread executing one or more individual functions, routines, subroutines, or operations of the method.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be needed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or storage media. In one implementation, method 300 may be performed by a processing device 102 executing the controller 104 as shown in FIG. 1.

Referring to FIG. 3, at 302, the processing device of MES 102 (or a separate computer system) may perform a computer simulation with optimization algorithms either as part of the simulator or as an external software package to the simulator, to produce a move list that may cause the WIPs substantially matching the target profile during the manufacture process. The simulation can be a discrete-event driven computer simulation, in which discrete events are fed into a computer model to generate the outcome. In this application, the events can be WIPs delivered to a block at a particular time, the model may include the groups of machines (and their capacities) applied to different steps or blocks, and the outcome is the WIPs distributed at different steps or blocks through the manufacture process. In one implementation, the events may be derived first based on operator experience. These events are WIP allocation moves between different blocks. The optimization operations can include linear programming, integer linear programming, non-linear programming, heuristics, simulated annealing, genetic algorithms, relaxation methods, combinatorial optimization, or a combination of the above. The optimization operations may include the same operations as used in MES, or may include more operations than those used in MES. The optimization operations may rely upon external software packages or external hardware resources. Then, the computer simulation is performed to determine the optimization that may ensure WIPs at different steps or blocks to match the target profile. The simulation may adjust the model (i.e., the requests to adjust the capacities assigned to different machines) to enable an optimal match between the WIPs at different steps or blocks and the target profile through the manufacture process.

Thus, at 304, the results of the simulation may determine the move list containing the number of wafers or wafer lots of each product step or block to be processed by each machine or machine group at certain time interval. MES may receive the move list from the simulation so that MES may follow the number of wafers or wafer lots to be processed in order to achieve the effect of optimization algorithms that has been proven to achieve the target profile during the manufacture process. An exemplary move list is shown in Table 1 where the number of wafers of each step to be processed by each machine within a 24-hour time interval is given to MES to be followed.

TABLE 1

Move List of Machines for Steps.

| Machines | Step 1 | Step 2 | Step 3 | Step 6 |
|---|---|---|---|---|
| M1 | 200 wafers | 0 | 0 | 300 |
| M2 | 300 wafers | 0 | 0 | 200 |
| M3 | 0 | 100 wafers | 150 wafers | 0 |
| M4 | 0 | 100 wafers | 100 wafers | 0 |
| M5 | 0 | 300 wafers | 0 | 0 |
| . . . | | | | |

In another implementation, instead of giving the number of wafers to be processed for each machine, the number of wafers may be given to each machine group. An exemplary move list is shown in Table 2 where the number of wafers of each step to be processed by each machine group within a 24-hour time interval is given to MES to be followed.

TABLE 2

Move List of Machine Groups for Steps.

| Machine Groups | Step 1 | Step 2 | Step 3 | Step 6 |
|---|---|---|---|---|
| {M1, M2} | 500 wafers | 0 | 0 | 500 wafers |
| {M3, M4, M5} | 0 | 500 wafers | 250 wafers | 0 |
| ... | | | | |

The results of the simulations generated at 304 may determine one or more assignment lists that assign machines or machine groups and their capacities to different blocks (or different product steps (P, S)) at different times of the day. The assignment lists may specify the percentages of different machines assigned to different blocks. In one implementation, the assignment lists may include a schedule for machines and the portions of their capacities assigned to different blocks (or different product steps (P, S)) over specified time periods.

The schedule may be represented in Table 3 where blocks are associated with different machines over different time periods. The assignment list is the percentage of time each machine or machine group works on a product step or block.

TABLE 3

Assignment List of Machines on Blocks.

| | 0:00-6:00 | 6:00-12:00 | 12:00-18:00 | 18:00-0:00 |
|---|---|---|---|---|
| Block 1 | 50% M1 | 50% M1 + 100% M2 | 100% M1 | 30% M1 |
| Block 2 | 50% M1 + 100% M2 | 50% M1 | 100% M2 | 70% M1 |
| Block 3 | 100% M3 + 100% M4 | 100% M3 + 100% M4 | 100% M3 + 100% M4 | 100% M3 + 100% M4 |
| Block 4 | ... | | | |

In another implementation, the assignment list may be given for each machine group. An exemplary assignment list is shown in Table 4 where the assignments of each machine group G1, G2, G3 within a 24-hour time interval is given to MES to be followed. The sum of assignment list of each machine group at any time may not exceed 100%.

TABLE 4

Assignment List of Machine Groups on Blocks.

| | 0:00-6:00 | 6:00-12:00 | 12:00-18:00 | 18:00-0:00 |
|---|---|---|---|---|
| Block 1 | 50% G1 | 75% G1 | 100% G1 | 100% G1 |
| Block 2 | 50% G1 75% G2 | 25% G1 100% G2 | 100% G2 | 70% G2 30% G3 |
| Block 3 | 25% G2 100% G3 | 100% G3 | 100% G3 | 70% G3 |
| Block 4 | ... | | | |

During the manufacture process, at 306, the processing device may issue requests to machine groups to maintain the WIPs at different blocks matching the target WIP profile. This may ensure the manufacture process runs smoothly and efficiently. In one implementation, the requests include a move list of WIP allocation moves for MES to execute. In this way, MES dos not need to interpret complex instructions. Instead, MES executes simple WIP allocation moves among different blocks (or steps).

At 308, the processing device may also monitor whether there is any deviation between the WIP at a block and the target WIP value for that block. The deviation may occur due to the occurrence of unexpected events such as, for example, the downtime of a machine. These unexpected events may cause the actual WIPs at different blocks to deviate from the target WIP profile. The processing device may monitor the difference between the actual WIP with the target value in the profile. The difference can be an absolute difference measured by the number of parts. Alternatively, the difference can a relative difference measured by the percentage difference between the actual WIP and the target value. Responsive to determining that the difference exceeds a threshold value (e.g., 10%), the processing device may determine that there is a deviation from the target profile caused by an external event.

At 310, responsive to detecting the deviation between the WIP and the target value, the processing device may issue additional requests to machine groups to reduce the deviation. For example, responsive detecting that the WIPs exceed the target value, the processing device may issue requests to the machine group responsible for producing the WIPs to take some machines offline or reduce their capacities assigned to the block. Responsive to detecting that the WIPs are below the target value, the processing device may issue requests to add additional machines to the block.

In one implementation, the requests may be issued at a pre-determined frequency such as, for example, once every few hours or daily. The controller 104 may issue the requests including the schedule of assignment list to machines. The machine groups may operate according to the schedule and compare the WIPs with the target values. If the target value is reached for a following block, the controller 104 may stop the machine groups from further processing.

In one implementation, the target WIP profile may vary depending different factors. For example, the target profile may vary for different days of the year (or of the month or week). The target profile may also vary for different products. For different target profiles, the processing device may run different simulations to determine the corresponding requests that control the operations of the machines in the semiconductor manufacture plant.

FIG. 4 depicts a block diagram of a computer system operating in accordance with one or more aspects of the present disclosure. In various illustrative examples, computer system 400 may correspond to a computing device within MES 102 of FIG. 1.

In certain implementations, computer system 400 may be connected (e.g., via a network, such as a Local Area Network (LAN), an intranet, an extranet, or the Internet) to other computer systems. Computer system 400 may operate in the capacity of a server or a client computer in a client-server environment, or as a peer computer in a peer-to-peer or distributed network environment. Computer system 400 may be provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 400 may include a processing device 402, a volatile memory 404 (e.g., random access memory (RAM)), a non-volatile memory 406 (e.g., read-only memory (ROM) or electrically-erasable programmable ROM (EEPROM)), and a data storage device 416, which may communicate with each other via a bus 408.

Processing device 402 may be provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 400 may further include a network interface device 422. Computer system 400 also may include a video display unit 410 (e.g., an LCD), an alphanumeric input device 412 (e.g., a keyboard), a cursor control device 414 (e.g., a mouse), and a signal generation device 420.

Data storage device 416 may include a non-transitory computer-readable storage medium 424 on which may store instructions 426 encoding any one or more of the methods or functions described herein, including instructions encoding WIP flow control of FIG. 1 for implementing method 300.

Instructions 426 may also reside, completely or partially, within volatile memory 404 and/or within processing device 402 during execution thereof by computer system 400, hence, volatile memory 404 and processing device 402 may also constitute machine-readable storage media.

While computer-readable storage medium 424 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "associating," "determining," "updating" or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may comprise a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform method 400 and/or each of its individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method comprising:
receiving, by a processing device of a manufacturing execution system (MES), a target profile associated with a product, wherein the target profile comprises an identifier of a block in a process to make the product and a target work-in-progress (WIP) value representing a target number of parts waiting to be processed by a group of machines used in the block to make the product, wherein the block comprises one or more manufacturing steps;
identifying at least one of a move list or an assignment list that, when issued, causes the group of machines to operate to maintain a number of parts waiting for processing to match the target WIP value of the target profile; and
issuing a request, comprising the at least one of the move list or the assignment list, to the group of machines to operate the group of machines, wherein the move list comprises at least one of a number of wafers or wafer lots to be processed or a WIP allocation move, and wherein the assignment list comprises an assignment of a respective percentage of capacity of each of the group of machines to the block, or a schedule of assigning the respective percentage of capacity of each of the group of machines to the block over a time period.

2. The method of claim 1, further comprising:
determining the at least one of the move list or the assignment list based on a computer simulation, wherein operations of the computer simulation comprise:
generating a plurality of events associated with at least part of the process to make the product, wherein the plurality of events comprise at least one of a number of parts delivered to the group of machines at a time or a WIP allocation move specifying an amount of parts, an origination group of machines and a destination group of machines, and a time at which to move the amount of parts from the origination group to the destination group;
calculating a plurality of WIP values based on a model reacting to the plurality of events;

selecting a first WIP value from the plurality of WIP values that is closest to the target WIP value; and determining the at least one of the move list or assignment list as one that generates an event corresponding to the first WIP value.

3. The method of claim 2, wherein to calculate the computer simulation, the processing device is further to:

adjust the model to calculate the plurality of WIP values, wherein adjusting the model comprises adjusting a capacity assigned to each of the group of machines.

4. The method of claim 1, wherein the target profile comprises a plurality of target WIP values, each of the plurality of target WIP values being associated with a respective block in the process to make the product, the method further comprising:

identifying a plurality of assignment lists that cause a plurality of groups of machines to operate to maintain parts waiting for processing at each block to match the corresponding target WIP value of the target profile.

5. The method of claim 1, further comprising:

detecting a deviation between the number of parts waiting for process and the target WIP value; and responsive to detecting the deviation, issuing a second request to change the assignment list of the group of machines.

6. The method of claim 5, wherein to change the assignment list comprises to cause one of reducing the capacity of at least one machine of the group of machines or adding the capacity of at least one machine of the group of machines.

7. The method of claim 1, wherein the MES is part of a plant, and the plant is a semiconductor manufacture plant, wherein the parts are at least one of wafers or wafer lots; wherein the process to make the product comprises a sequence of manufacture steps to fabricate from a wafer to an integrated circuit, and wherein the semiconductor manufacture plant comprises a plurality of groups of machines, each group being responsible for performing one or more of the sequence of manufacture steps.

8. The method of claim 1, wherein capacity of at least one of the group of machines is assigned to more than one block in the process to make the product.

9. A manufacturing execution system (MES), comprising a storage device to store a target profile associated with a product;

a processing device, communicatively coupled with the storage device, to:

receive the target profile comprising an identifier of a block in a process to make the product and a target work-in-progress (WIP) value representing a target number of parts waiting to be processed by a group of machines used in the block or block to make the product, wherein the block comprises one or more manufacturing steps;

identify at least one of a move list or assignment list that, when issued, causes the group of machines to operate to maintain a number of parts waiting for processing to match the target WIP value of the target profile; and issue a request, comprising the at least one of the move list or the assignment list, to the group of machines to operate, wherein the move list comprises at least one of a number of wafers or wafer lots to be processed or a WIP allocation move, and wherein the assignment list comprises an assignment of a respective percentage of capacity of each of the group of machines to the block, or a schedule of assigning the respective percentage of capacity of each of the group of machines to the block over a time period.

10. The manufacturing execution system of claim 9, wherein the processing device is further to:

determine the at least one of the move list or the assignment list based on a computer simulation, wherein to perform the computer simulation, the processing device is to:

generate a plurality of events associated with at least part of the process to make the product, wherein the plurality of events comprise at least one of a number of parts delivered to the group of machines at a time or a WIP allocation move specifying an amount of parts, an origination group of machines and a destination group of machines, and a time at which to move the amount of parts from the origination group to the destination group;

calculate a plurality of WIP values based on a model reacting to the plurality of events;

select a first WIP value from the plurality of WIP values that is closest to the target WIP value; and determine the at least one of the move list or the assignment list as one that generates an event corresponding to the first WIP value.

11. The system of claim 10, wherein to calculate the computer simulation, the processing device is further to:

adjust the model to calculate the plurality of WIP values, wherein adjusting the model comprises adjusting a capacity assigned to each of the group of machines.

12. The system of claim 9, wherein the target profile comprises a plurality of target WIP values, each of the plurality of target WIP values being associated with a respective block in the process to make the product, and wherein the processing device is to:

identify a plurality of assignment lists that cause a plurality of groups of machines to operate to maintain parts waiting for processing at each block to match the corresponding target WIP value of the target profile.

13. The system of claim 9, wherein the processing device:

detect a deviation between the number of parts waiting for process and the target; and responsive to detecting the deviation, issue a second request to change the assignment list of the group of machines.

14. The system of claim 13, wherein to change the assignment list, the second request is to cause one of reducing the capacity of at least one machine of the group of machines or adding the capacity of at least one machine of the group of machines.

15. The system of claim 9, wherein the MES is part of a plant, and the plant is a semiconductor manufacture plant, wherein the parts are at least one of wafers or wafer lots; wherein the process to make the product comprises a sequence of manufacture steps to fabricate from a wafer to an integrated circuit, and wherein the semiconductor manufacture plant comprises a plurality of groups of machines, each group being responsible for performing one or more of the sequence of manufacture steps.

16. The system of claim 9, wherein capacity of at least one of the group of machines is assigned to more than one block in the process to make the product.

17. A non-transitory machine-readable storage medium storing instructions which, when executed, cause a processing device to:

receive, by the processing device of a manufacturing execution system (MES), a target profile associated with a product, wherein the target profile comprises an identifier of a block in a process to make the product and a target work-in-progress (WIP) value representing a target number of parts waiting to be processed by a group of machines used in the block to make the product, wherein the block comprises one or more manufacturing steps;

identify at least one of a move list or an assignment list that, when issued, causes the group of machines to operate to maintain a number of parts waiting for processing to match the target WIP value of the target profile; and issue a request, comprising the at least one of the move list or the assignment list, to the group of machines to operate the group of machines, wherein the move list comprises at least one of a number of wafers or wafer lots to be processed or a WIP allocation move, and wherein the assignment list comprises an assignment of a respective percentage of capacity of each of the group of machines to the block, or a schedule of assigning the respective percentage of capacity of each of the group of machines to the block over a time period.

18. The non-transitory machine-readable storage medium of claim 17, wherein the processing device is further to: determine the at least one of the move list or the assignment list based on a computer simulation, wherein to perform the computer simulation, the processing device is to:

generate a plurality of events associated with at least part of the process to make the product, wherein the plurality of events comprise at least one of a number of parts delivered to the group of machines at a time or a WIP allocation move specifying an amount of parts, an origination group of machines and a destination group of machines, and a time at which to move the amount of parts from the origination group to the destination group;

calculate a plurality of WIP values based on a model reacting to the plurality of events;

select a first WIP value from the plurality of WIP values that is closest to the target WIP value; and determine the at least one of the move list or the assignment list as one that generates an event corresponding to the first WIP value.

* * * * *